United States Patent
Pagliaro et al.

(10) Patent No.: US 9,240,335 B2
(45) Date of Patent: Jan. 19, 2016

(54) WAFER CLEANING APPARATUS AND WAFER CLEANING METHOD USING THE SAME

(75) Inventors: Robert Henry Pagliaro, Mesa, AZ (US); Sung Ho Hong, Yongin-si (KR); Jin Tae Kim, Yongin-si (KR); Deok Ho Kim, Yongin-si (KR)

(73) Assignee: APET, Hwaseong-si (KR)

(*) Notice: Subject to any disclaimer, the term of this patent is extended or adjusted under 35 U.S.C. 154(b) by 140 days.

(21) Appl. No.: 13/383,201

(22) PCT Filed: Dec. 3, 2009

(86) PCT No.: PCT/KR2009/007192
§ 371 (c)(1),
(2), (4) Date: Mar. 8, 2012

(87) PCT Pub. No.: WO2011/004942
PCT Pub. Date: Jan. 13, 2011

(65) Prior Publication Data
US 2012/0152276 A1    Jun. 21, 2012

(30) Foreign Application Priority Data
Jul. 10, 2009  (KR) .................. 10-2009-0063083

(51) Int. Cl.
*B08B 3/08*    (2006.01)
*H01L 21/02*   (2006.01)
*H01L 21/67*   (2006.01)

(52) U.S. Cl.
CPC ............ *H01L 21/67017* (2013.01); *B08B 3/08* (2013.01); *H01L 21/02052* (2013.01)

(58) Field of Classification Search
CPC ................................................. H01L 21/67017
USPC .................................................. 134/109, 902
See application file for complete search history.

(56) References Cited

U.S. PATENT DOCUMENTS

2004/0139987 A1*  7/2004  Mount ........................... 134/1.3
2004/0191079 A1*  9/2004  Ohmi et al. ................... 417/244
2009/0165829 A1   7/2009  Morita et al.

FOREIGN PATENT DOCUMENTS

EP       1 571 701 A1    9/2005
JP       5-335295        12/1993
(Continued)

OTHER PUBLICATIONS

Niimura, "JP05335295A English Machine Translation.pdf", Dec. 17, 1993—Machine translation from PAJ.*
International Search Report, corresponding to PCT/KR2009/007192, dated Jul. 16, 2010, 4 pages.
(Continued)

*Primary Examiner* — Michael Barr
*Assistant Examiner* — Levon J Shahinian
(74) *Attorney, Agent, or Firm* — Christie, Parker & Hale, LLP

(57) ABSTRACT

The object of the present invention is to provide a wafer cleaning apparatus that reduces the amount of dissolved oxygen, without using hydrogen peroxide, to be able to reduce the deformation, etc. of a wafer and to reduce silicon consumption and a wafer cleaning method using the same.
The present invention provides a wafer cleaning apparatus comprising: a first thin film contactor that receives drug solution for removing an oxide film or ultra pure water to separate and discharge gas dissolved in the drug solution for removing the oxide film or the ultra pure water; a second thin film contactor that receives the drug solution for removing the oxide film or the ultra pure water discharged from the first thin film contactor; a vacuum pump that discharges gas separated in the first and second thin film contactors to the outside; and a process vessel that stores the drug solution for removing the oxide film or the ultra pure water discharged from the second thin film contactor, and a wafer cleaning method using the same.

13 Claims, 2 Drawing Sheets

(56) References Cited

FOREIGN PATENT DOCUMENTS

| | | |
|---|---|---|
| JP | 11-16873 | 1/1999 |
| JP | 2006-269668 A | 10/2006 |
| JP | 2008-080255 A | 4/2008 |
| KR | 10-0213243 | 5/1998 |
| KR | 10-2009-0007701 | 1/2009 |

OTHER PUBLICATIONS

Korean Intellectual Property Office (KIPO); Office action dated Mar. 8, 2011 for Application No. KR 10-2009-0063083; 3 Pages.

Korean Intellectual Property Office (KIPO); Notice of Allowance dated Nov. 30, 2011 for Application No. KR 10-2009-0063083; 1 Page.

* cited by examiner

WAFER CLEANING APPARATUS AND WAFER CLEANING METHOD USING THE SAME

CROSS-REFERENCE TO RELATED APPLICATION

This application is a National Phase Patent Application and claims the priority of International Application Number PCT/KR2009/007192, filed on Dec. 3, 2009, which claims priority of Korean Patent Application Number 10-2009-0063083, filed on Jul. 10, 2009.

TECHNICAL FIELD

The present invention relates to a wafer cleaning apparatus and a wafer cleaning method using the same, and more particularly, to a wafer cleaning apparatus that can reduce the damage and deformation of a wafer when cleaning the wafer and a wafer cleaning method using the same.

BACKGROUND ART

Currently, semiconductor manufacturing technology has been highly integrated to be 10 nm or less and has been continuously developing. Owing to the high-integration, the line width becomes narrow in the production of silicon wafers used in producing a semiconductor, and change in patterns, temperature, silicon consumption, etc. become very important factors.

Generally, a cleaning method using hydrogen peroxide ($H_2O_2$) or a cleaning method using ozone ($O_3$) is used in a wafer. The cleaning method using hydrogen peroxide ($H_2O_2$) is a method to remove particles by mixing hydrogen peroxide, ammonia, and pure water, and the cleaning method using ozone ($O_3$) is a method to remove organic material by mixing ozone with sulfuric acid.

However, if the cleaning method using hydrogen peroxide and the cleaning method using ozone are used, oxygen in the cleaning liquid is reacted to the wafer silicon to generate chemical oxide. Therefore, in order to remove the chemical oxide, it has been adopted a method to etch the surface of the wafer using hydrogen fluoride at the last step of cleaning.

However, although the method to etch the surface of the wafer using hydrogen fluoride at the last step is used, the oxide is also defected from the surface of the wafer. In particular, the method to use the hydrogen fluoride at the last step causes a problem in a fine process of 90 nm or less.

In particular, after cleaning, the silicon consumption of 1 Å or less has been recently required. It means that the cleaning method using hydrogen peroxide and the cleaning method using ozone are not suitable for cleaning the wafer.

DETAILED DESCRIPTION OF THE INVENTION

Technical Problem

The present invention is proposed to solve the problems. The object of the present invention is to provide a wafer cleaning apparatus that reduces the amount of dissolved oxygen, without using hydrogen peroxide, to be able to reduce the deformation, etc. of a wafer and to reduce silicon consumption and a wafer cleaning method using the same.

Technical Solving Mode

To achieve the above object, according to one embodiment of the present invention, there is provided a wafer cleaning apparatus including: a first thin film contactor that receives drug solution for removing an oxide film or ultra pure water to separate and discharge gas dissolved in the drug solution for removing the oxide film or the ultra pure water; a second thin film contactor that receives the drug solution for removing the oxide film or the ultra pure water discharged from the first thin film contactor; a vacuum pump that discharges gas separated in the first and second thin film contactors to the outside; and a process vessel that stores the drug solution for removing the oxide film or the ultra pure water discharged from the second thin film contactor.

Moreover, the drug solution for removing the oxide film includes hydrogen fluoride or buffered oxide etchant (BOE).

Further, the hydrogen fluoride has a concentration of 0.01 to 49 wt %.

In addition, the concentration of the dissolved oxygen is 500 ppt or less in the drug solution for removing the oxide film or the ultra pure water.

According to one embodiment of the present invention, there is provided a wafer cleaning method in which the oxide film of the surface of a silicon wafer is removed and is hydrogen-terminated so that a natural oxide film is not grown on the surface of the wafer, the wafer cleaning method including: after supplying drug solution for removing the oxide film to a thin film contactor, driving a vacuum pump and then injecting nitrogen into the thin film contactor; removing the dissolved gas of the drug solution for removing the oxide film by discharging the gas by the vacuum pump; and cleaning the surface of the wafer using the drug solution for removing the oxide film to be hydrogen-terminated.

Moreover, the drug solution for removing the oxide film includes hydrogen fluoride or BOE.

Further, the hydrogen fluoride has a concentration of 0.01 to 49 wt %.

In addition, the concentration of the dissolved oxygen is 500 ppt or less in the drug solution for removing the oxide film or the ultra pure water.

Advantageous Effect

With the wafer cleaning apparatus and the wafer cleaning method using the same according to the present invention, the amount of dissolved oxygen in the drug resolution for removing the oxide film can be reduced, making it possible to reduce the oxide generated from the surface of the wafer when cleaning the silicon wafer. Therefore, the fine process work can be easily performed.

BRIEF DESCRIPTION OF THE DRAWING

The above and other objects, features and advantages of the present invention will become apparent from the following description of preferred embodiments given in conjunction with the accompanying drawings, in which.

BEST MODES FOR CARRYING OUT THE INVENTION

Hereinafter, exemplary embodiments of the present invention will be described in detail with reference to the accompanying drawings.

Figure 1:
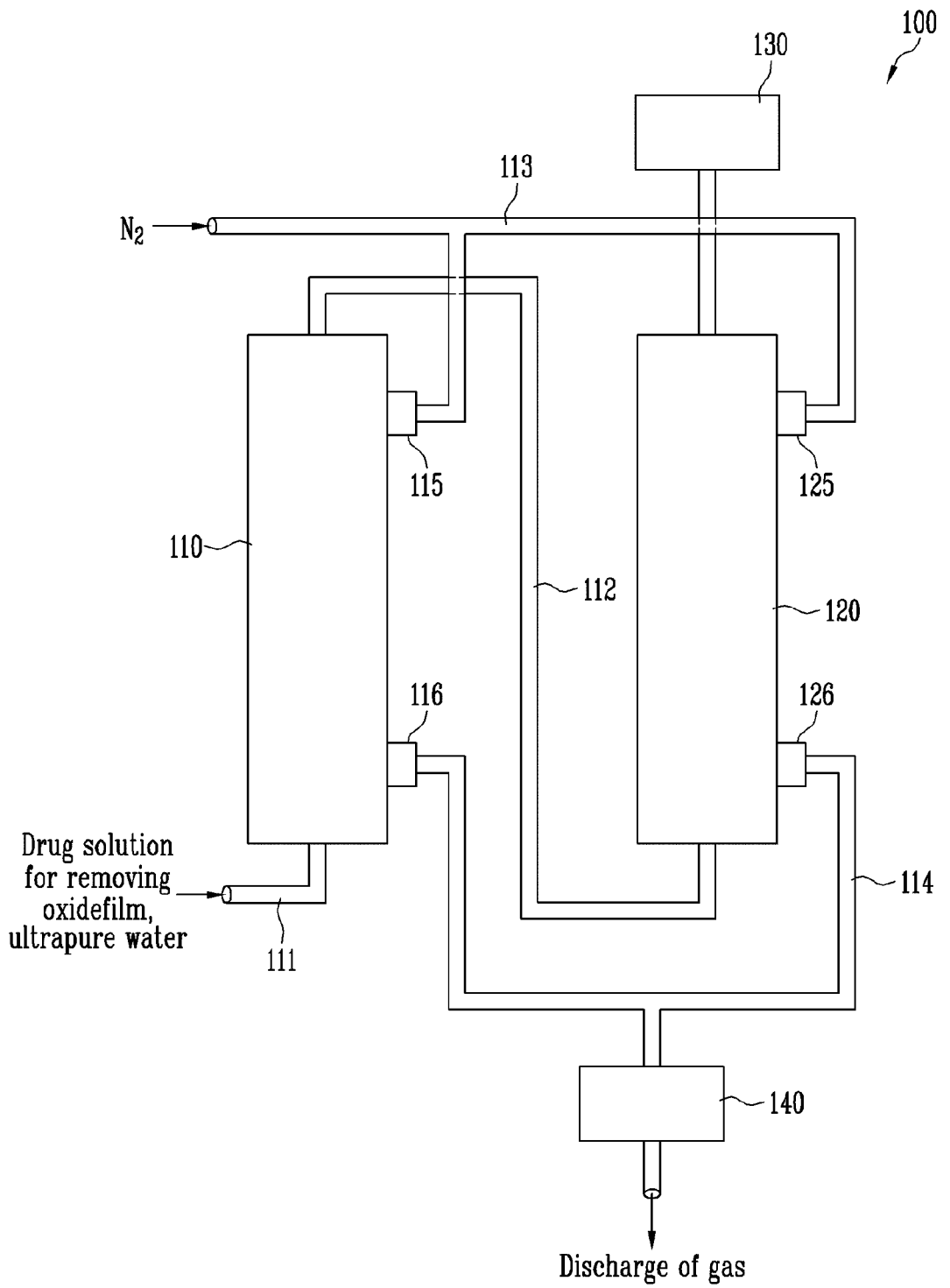
FIG. 1 is a diagram showing the structure of a wafer cleaning apparatus according to the present invention.
Figure 2:
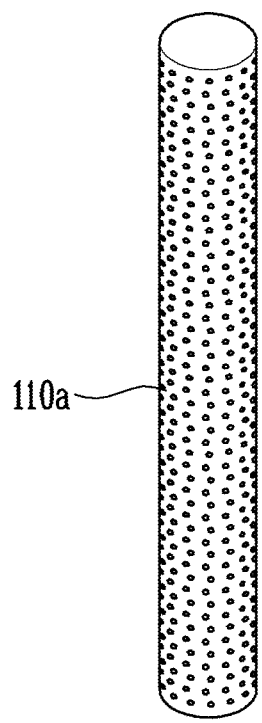
FIG. 2 is a diagram showing the structure of a porous polymer membrane contactor in a thin film contactor.

FIG. 1 is a diagram showing the structure of a wafer cleaning apparatus according to the present invention, and FIG. 2 is a diagram showing the structure of a porous polymer membrane contactor in a thin film contactor. Referring to FIGS. 1 and 2, the wafer cleaning apparatus 100 includes a first thin film contactor 110, a second thin film contactor 120, a process vessel 130, and a vacuum pump 140.

The first thin film contactor 110 and the second thin film contactor 120 have a porous polymer membrane contactor 110a therein to remove gas. A plurality of small holes are formed on the surface of the porous polymer membrane contactor 110a and a filter whose inside is hollow is provided. Also, the first thin film contactor 110 and the second thin film contactor 120 include first and second gas inlets 115 and 125 and first and second gas outlets 116 and 126, respectively.

The first thin film contactor 110 receives drug solution for removing an oxide film or ultra pure water from a first pipe 111. And, the first thin film contactor 110 is coupled to the second thin film contactor 120 by a second pipe 112. Also, the first thin film contactor 110 and the second thin film contactor 120 receives nitrogen through a third pipe 113 that is coupled to first and second gas inlets 115 and 125. And, the first thin film contactor 110 and the second thin film contactor 120 allows the vacuum pump 140 coupled to a fourth pipe 114 that is coupled to the first and second gas outlets 116 and 126 to discharge the gas dissolved in the drug solution for removing the oxide film or the ultra pure water through the fourth pipe 114. The drug solution for removing the oxide film includes hydrogen fluoride (HF) and/or buffered oxide etchant (BOE), and the gas dissolved in the drug solution for removing the oxide film includes oxygen ($O_2$), carbon dioxide ($CO_2$), carbon monoxide (CO), total organic carbon (TOC), etc.

Gas is dissolved in the drug solution for removing the oxide film or the ultra pure water that is supplied to the first thin film contactor 110 through the first pipe 111.

Moreover, if the drug solution for removing the oxide film is supplied to the first thin film contactor 110 and the second thin film contactor 120 to drive the vacuum pump 140 and then nitrogen is supplied thereto, nitrogen is discharged to the first and second gas outlets 116 and 126 by the vacuum pump 140 at the moment when nitrogen is supplied through the first and second gas inlets 115 and 125. At this moment, the gases dissolved in the drug solution for removing the oxide film are reacted to nitrogen to be easily flowed into the vacuum pump 140 so that the removal efficiency of the gas dissolved in the drug solution for removing the oxide film or the ultra pure water is enhanced. The vacuum pump 140 discharges the gas at the pressure of 27 inch Hg at maximum.

The drug solution for removing the oxide film whose gas is removed by the first and second thin film contactors 120 is supplied to the process vessel 130.

The process vessel 130 stores the drug solution for removing the oxide film whose gas is separated by the first thin film contactor 110 and the second thin film contactor 120 to allow it to be used in the cleaning process. Also, the drug solution for removing the oxide film can be diluted using the ultra pure water whose gas is separated by the first thin film contactor 110 and the second thin film contactor 120. The concentration of the dissolved oxygen in the drug solution for removing the oxide film stored in the process vessel 130 becomes 500 ppt or less.

The reason why the concentration of the dissolved oxygen becomes 500 ppt or less is that there is a close interrelation between the dissolved oxygen in the hydrogen fluoride and residual oxide. The reason will be described below.

i) Water has an influence on low-concentration fluorine positioned on Si—OH group etched by hydrogen fluoride.

ii) The portion affected by the low-concentration fluorine generates a thermal exciton where an electron and a hole are coupled.

iii) A crack of Si—Si back bond is generated due to the exciton so that it is divided into Si– on the surface and $Si^+$ under the surface.

iv) $Si^+$ under the surface is coupled with water molecules and Si– on the surface is changed into SiOO— form by the dissolved oxygen so that a proton is transitioned into SiOO— from additive of water in Si—OH and Si—OOH.

From the above results, it can be appreciated that oxygen causes improved oxidation through the inter-coupling effects between water ($H_2O$) and OH—, and between water ($H_2O$) and $O_2$.

In other words, the amount of the oxide film generated on the surface of the wafer according to oxygen dissolved in solution, that is, the amount of dissolved oxygen. Therefore, the amount of dissolved oxygen of the drug solution for removing the oxide film or the ultra pure water, etc. becomes a very important factor, and it is very important to remove the dissolved oxygen from the drug solution for removing the oxide film or the ultra pure water, etc.

In the present invention, the mixture ratio between the ultra pure water whose amount of dissolved oxygen is 500 ppt and hydrogen fluoride becomes 100:1 or more.

Moreover, if the surface of the wafer is cleaned by the drug solution for removing the oxide film diluted by the drug solution for removing the oxide film or the ultra pure water contained in the process vessel according to the present invention, the surface of the silicon wafer is hydrogen-terminated and the oxide film formed on the surface of the silicon wafer has a thickness of 1 Å or less.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A wafer cleaning apparatus comprising:
    a first thin film contactor that receives drug solution for removing an oxide film or ultra pure water and receives nitrogen to separate and discharge gas dissolved in the drug solution for removing the oxide film or the ultra pure water;
    a second thin film contactor that receives the drug solution for removing the oxide film or the ultra pure water discharged from the first thin film contactor;
    a vacuum pump that discharges gas separated in the first and second thin film contactors to the outside;
    a process vessel that stores the drug solution for removing the oxide film or the ultra pure water discharged from the second thin film contactor;
    a first pipe in fluid communication with the first thin film contactor and for supplying the drug solution for removing the oxide film or the ultra pure water to the first thin film contactor;
    a second pipe through which the drug solution for removing the oxide film or the ultra pure water discharged from the first thin film contactor passes; and
    a third pipe for supplying the nitrogen to the first thin film contactor,
    wherein the first thin film contactor includes a first gas inlet coupled to the third pipe, wherein the second thin film contactor includes a second gas inlet coupled to the third pipe so that nitrogen is supplied to the second thin film contactor, wherein the third pipe includes a first branch coupled to the first gas inlet and a second branch coupled to the second gas inlet to thereby supply the nitrogen to the first and second thin film contactor in parallel, and wherein at least one of the first and second thin film contactors comprises a porous membrane contactor that is separate from the process vessel.

2. The wafer cleaning apparatus as claimed in claim 1, wherein the first thin film contactor is configured to receive the drug solution.

3. The wafer cleaning apparatus as claimed in claim 2, wherein the drug solution comprises hydrogen fluoride or buffered oxide etchant (BOE).

4. The wafer cleaning apparatus as claimed in claim 2, wherein the drug solution comprises hydrogen fluoride and the hydrogen fluoride has a concentration of 0.01 to 49 wt %.

5. The wafer cleaning apparatus as claimed in claim 2, wherein the drug solution comprises hydrogen fluoride and buffered oxide etchant (BOE).

6. The wafer cleaning apparatus as claimed in claim 5, wherein the hydrogen fluoride has a concentration of 0.01 to 49 wt %.

7. The wafer cleaning apparatus as claimed in claim 1, wherein the concentration of dissolved oxygen is 500 ppt or less in the drug solution for removing the oxide film or the ultra pure water.

8. The wafer cleaning apparatus as claimed in claim 1, wherein the porous membrane contactor includes a cylindrical surface and a hollow defined by an inside of the cylindrical surface.

9. The wafer cleaning apparatus as claimed in claim 1, wherein the porous membrane contactor separates dissolved oxygen from the drug solution for removing the oxide film or the ultra pure water.

10. The wafer cleaning apparatus as claimed in claim 1,
wherein the first gas inlet is adjacent to downstream of the drug solution for removing the oxide film or the ultra pure water which flows in the first thin film contactor.

11. The wafer cleaning apparatus as claimed in claim 1, wherein the first thin film contactor further includes a first gas outlet, and wherein the first gas outlet is adjacent to upstream of the drug solution for removing an oxide film or the ultra pure water which flows in the first thin film contactor.

12. The wafer cleaning apparatus as claimed in claim 11, further comprising a fourth pipe which is coupled to the first gas outlet and the vacuum pump.

13. The wafer cleaning apparatus as claimed in claim 1, wherein the second pipe is in fluid communication with the second thin film contactor to thereby supply the drug solution for removing the oxide film or the ultra pure water discharged from the first thin film contactor to the second thin film contactor.

* * * * *